(12) United States Patent
Chiang (10) Patent No.: US 8,191,614 B2
(45) Date of Patent: Jun. 5, 2012

(54) HEAT RADIATING UNIT STRUCTURE AND HEAT SINK THEREOF

(75) Inventor: Kuei-Feng Chiang, Sinjhuang (TW)

(73) Assignee: Asia Vital Components Co., Ltd., Taipei County (TW)

( * ) Notice: Subject to any disclaimer, the term of this patent is extended or adjusted under 35 U.S.C. 154(b) by 199 days.

(21) Appl. No.: 12/556,569

(22) Filed: Sep. 9, 2009

(65) Prior Publication Data

US 2011/0024100 A1 Feb. 3, 2011

(51) Int. Cl.
*H05K 7/20* (2006.01)
(52) U.S. Cl. .................................. 165/80.3; 361/710
(58) Field of Classification Search .............. 165/80.3, 165/185; 361/704, 710
See application file for complete search history.

(56) References Cited

U.S. PATENT DOCUMENTS

| | | | | |
|---|---|---|---|---|
| 3,216,496 A * | 11/1965 | Katz | ............................ | 165/185 |
| 5,014,776 A * | 5/1991 | Hess | ............................ | 165/185 |
| 5,819,407 A * | 10/1998 | Terada | ........................ | 29/890.03 |
| 6,279,648 B1 * | 8/2001 | Diels et al. | .................... | 165/80.3 |
| 6,742,581 B2 * | 6/2004 | Mochizuki et al. | ........... | 165/185 |
| 7,286,352 B2 * | 10/2007 | Curtis et al. | .................. | 361/697 |
| 2006/0180486 A1 * | 8/2006 | Bennett | ....................... | 206/308.1 |
| 2009/0194253 A1 * | 8/2009 | Shen | ............................... | 165/78 |
| 2009/0195986 A1 * | 8/2009 | Shen | ............................. | 361/704 |

FOREIGN PATENT DOCUMENTS

EP 0867937 A2 9/1998

* cited by examiner

*Primary Examiner* — Allen Flanigan (57) ABSTRACT

A heat radiating unit is provided on a front face with at least one raised strip having a curved head portion and a neck portion, the neck portion being located at a joint of the raised strip and the heat radiating unit and having a width smaller than that of the curved head portion; and on a reverse face with at least one receiving groove opposite to the raised strip, the receiving groove having a curved recess portion and an engaging shoulder portion, and the engaging shoulder portion being located at a joint of the receiving groove and the heat radiating unit. A plurality of the heat radiating units can be assembled to provide a heat sink by engaging the curved head portion and the neck portion of one heat radiating unit with the curved recess portion and the engaging shoulder portion, respectively, of another heat radiating unit.

2 Claims, 8 Drawing Sheets

HEAT RADIATING UNIT STRUCTURE AND HEAT SINK THEREOF

This application claims the priority of Taiwan patent application number 098213916 filed on Jul. 29, 2009.

FIELD OF THE INVENTION

The present invention relates to a heat radiating unit structure and a heat sink thereof, and more particularly to heat radiating units that can be stacked and assembled to provide a heat sink through engagement of raised strips with receiving grooves.

BACKGROUND OF THE INVENTION

An electronic apparatus generally includes an enclosure to define a closed inner space, within which a plurality of different electronic elements work for the electronic apparatus to operate. These electronic elements produce heat during work. Therefore, elements capable of dissipating heat produced by the electronic elements must be additionally provided in the electronic apparatus to help in cooling the heat-producing electronic elements. Heat sink is one example of such heat dissipating elements to assist in quick dissipation of heat. The conventional heat sink is normally made of a metal material having high heat conductivity. In the past, a big-scale heat sink is manufactured by integral molding through casting or forging. To manufacture the heat sink by casting or forging, it is necessary to develop a big-size mold, which is not only heavy and inconvenient to manufacture and transport, but also expensive and non-economic for use.

Figure 1:
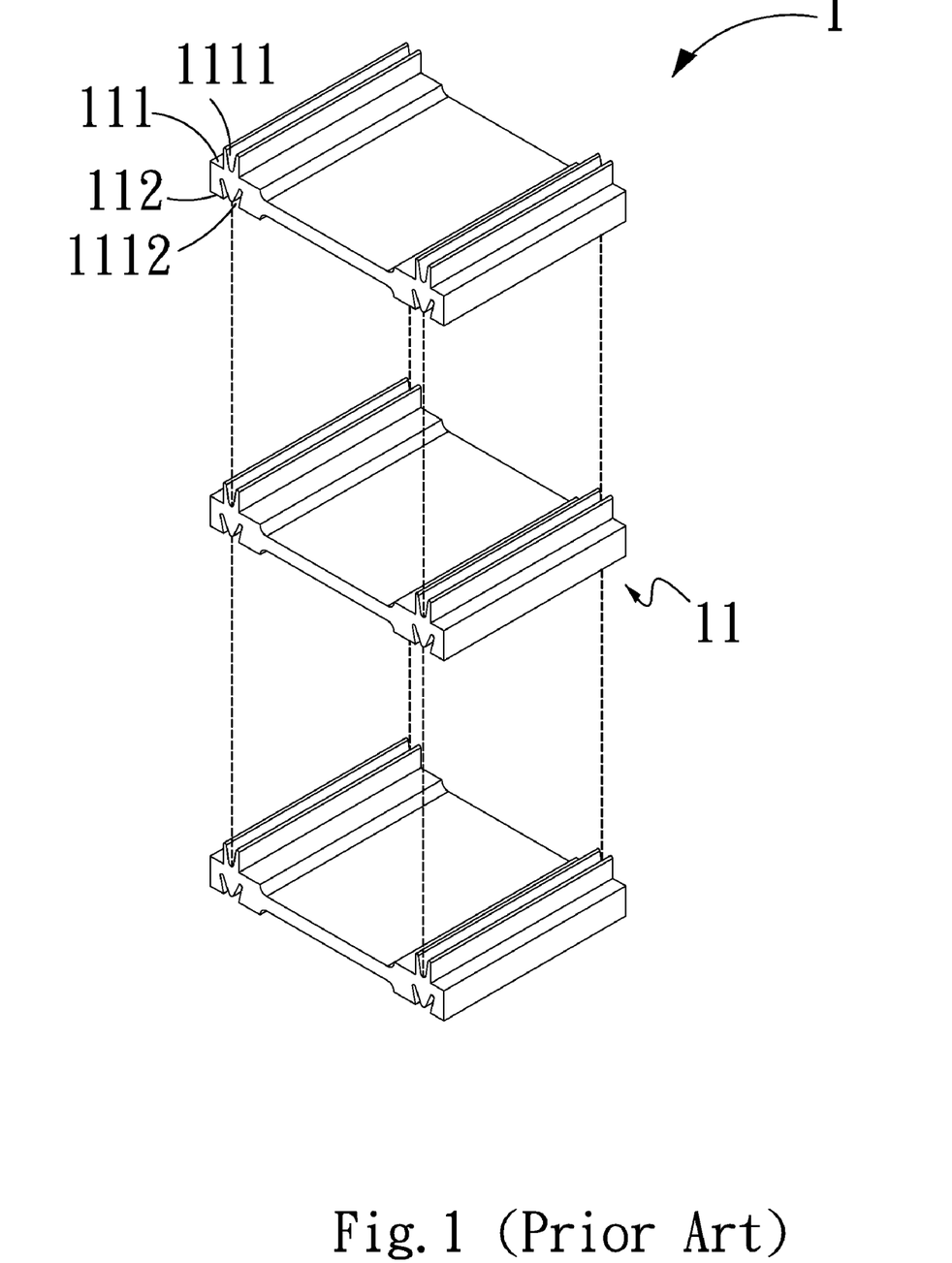
FIG. 1 is an exploded perspective view of a conventional heat sink with modular heat radiating units.
Figure 2:
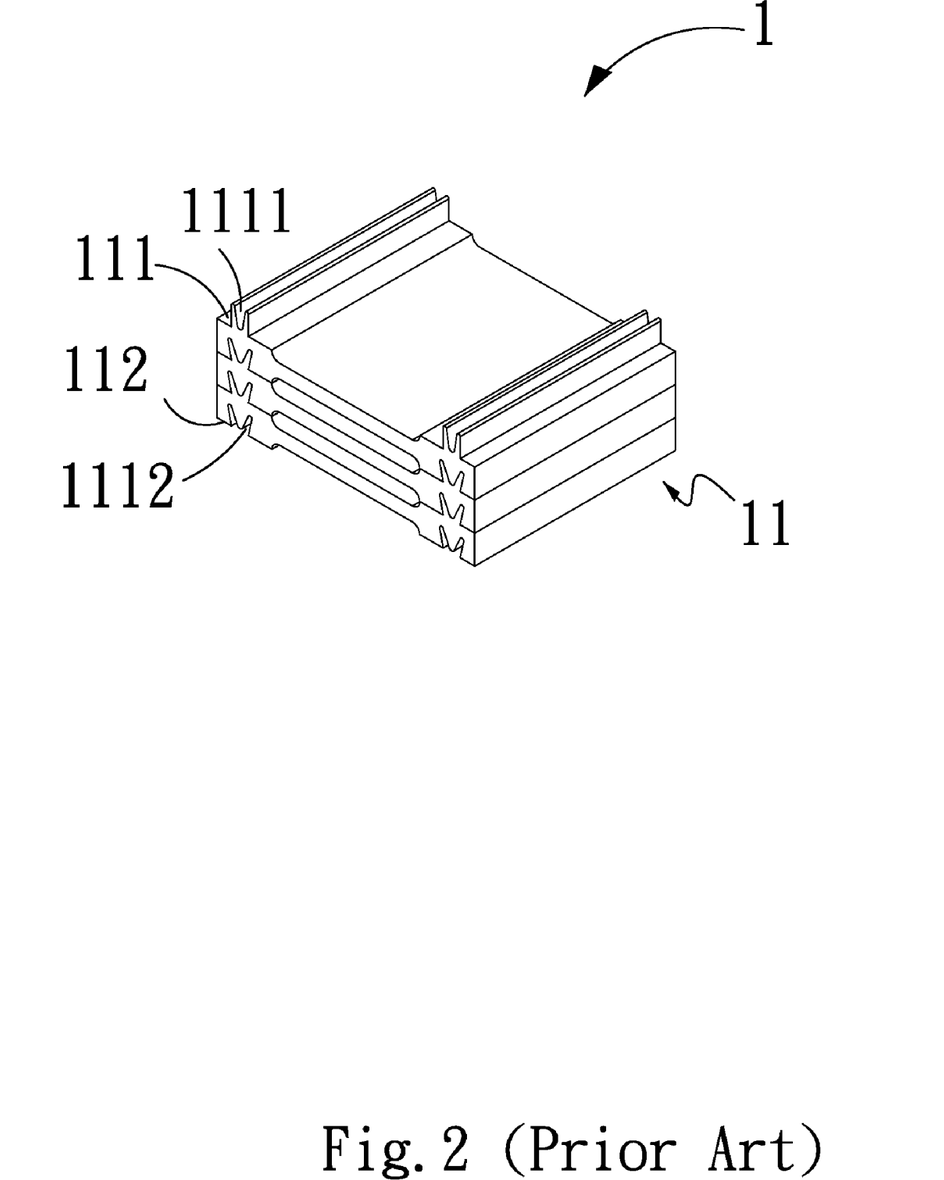
FIG. 2 is an assembled view of FIG. 1.
Figure 3:
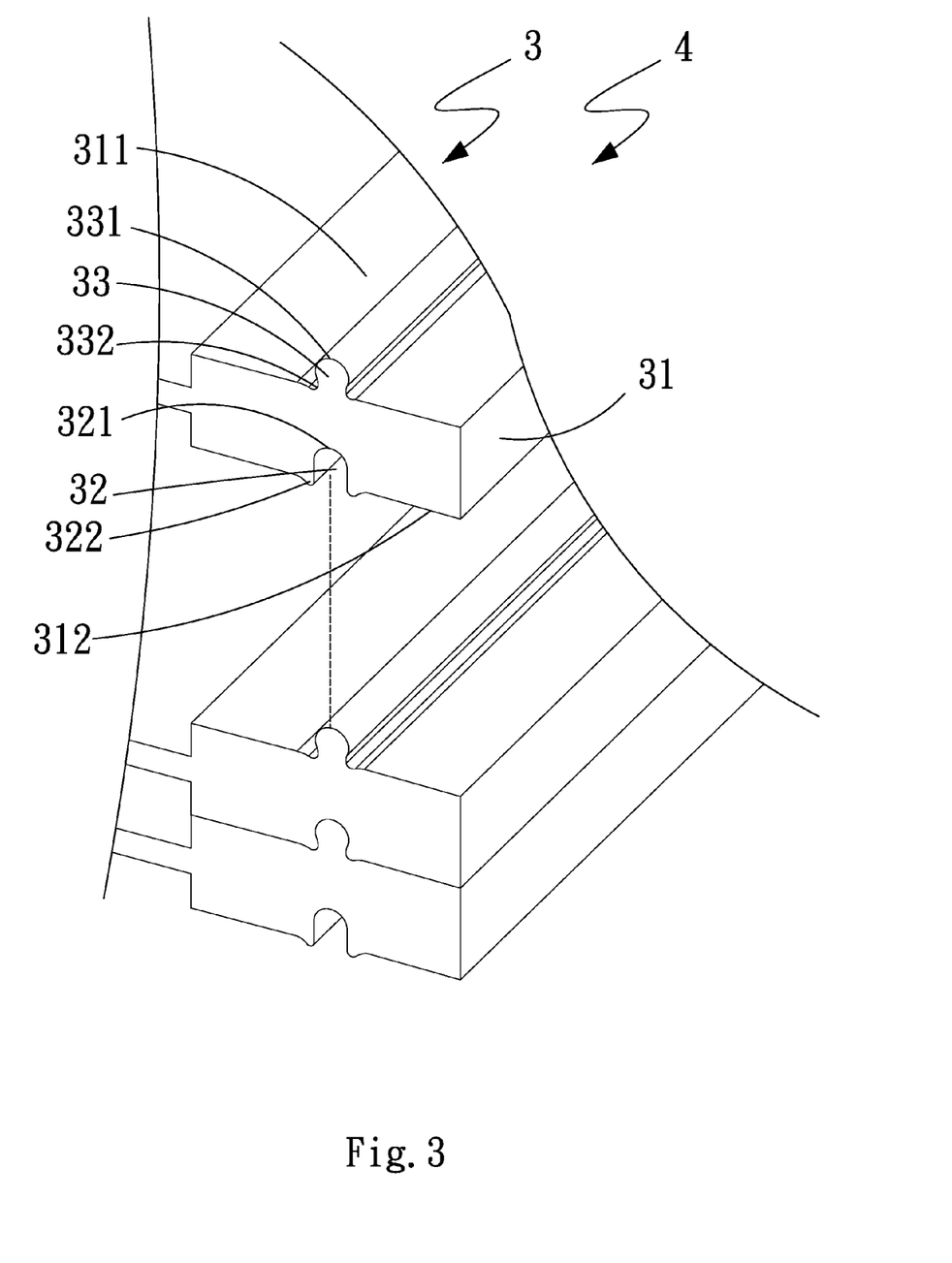
FIG. 3 is a fragmentary and partially exploded perspective view showing a plurality of heat radiating units according to an embodiment of the present invention for assembling into a heat sink.
Figure 4:
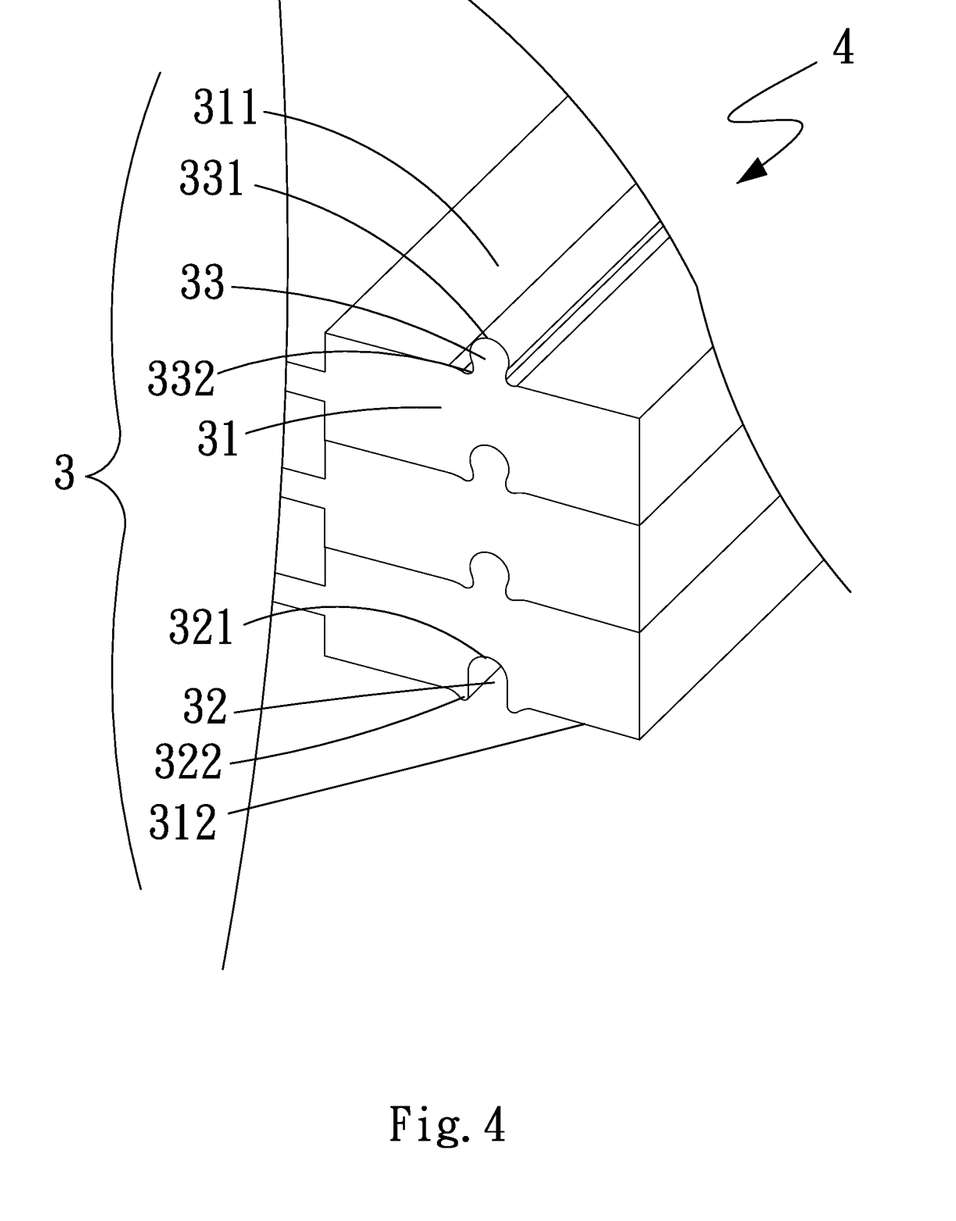
FIG. 4 is an assembled view of FIG. 3.
Figure 5:
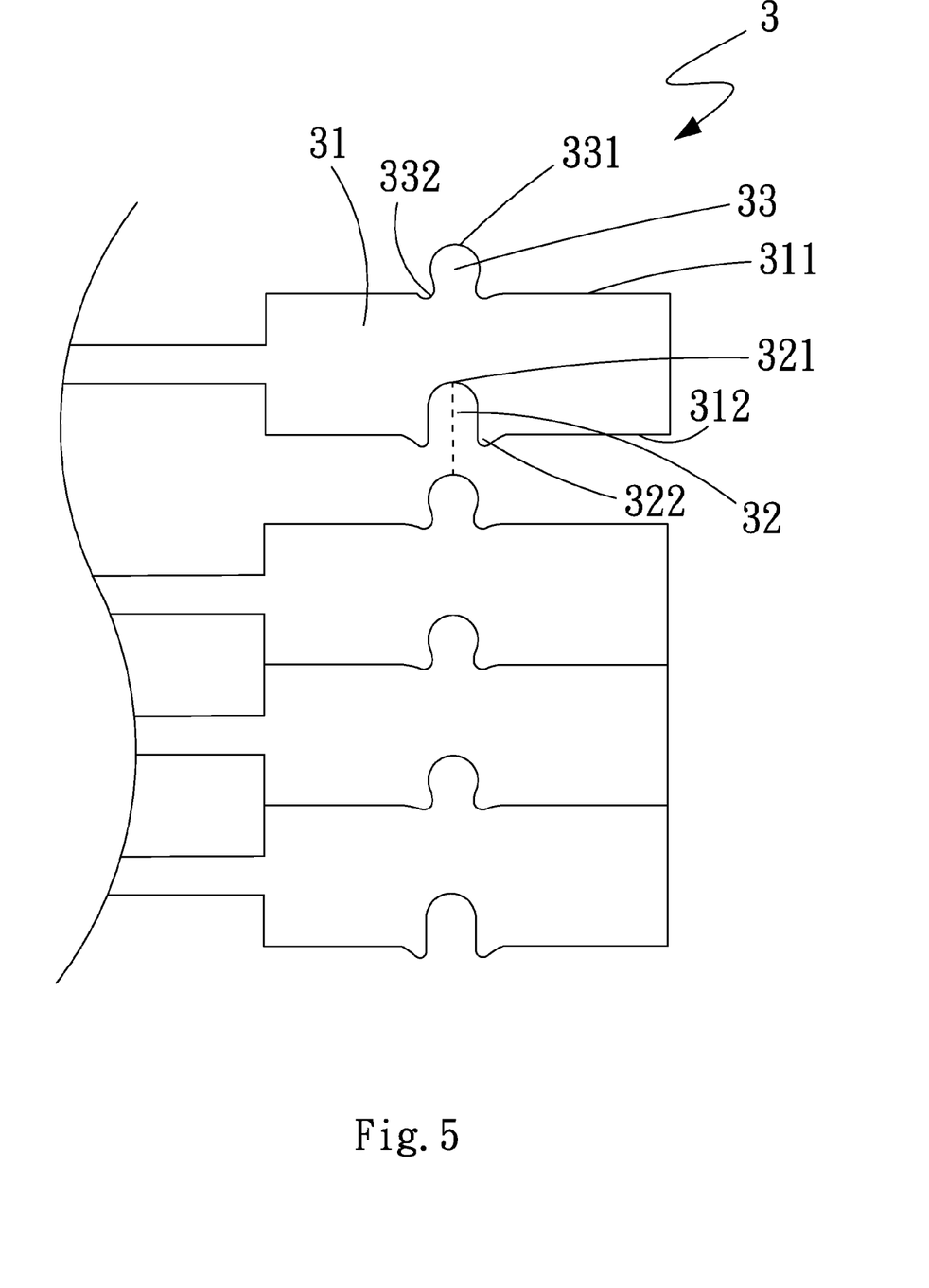
FIGS. 5 to 8 are side views showing the assembling of the heat radiating units of the present invention into a heat sink.
Figure 6:
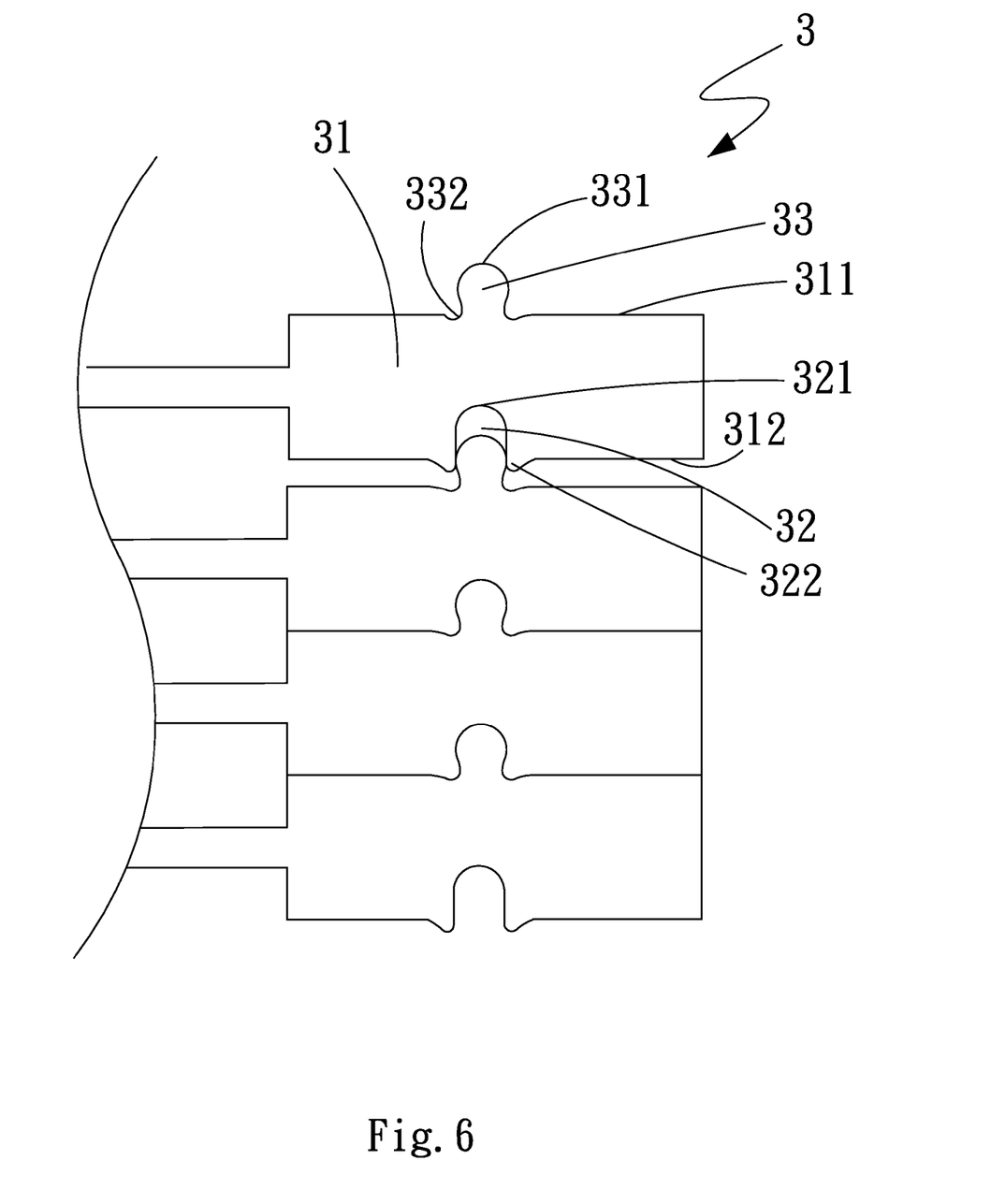

Please refer to FIGS. 1 and 2. In a conventional technique for providing a heat sink 1 by way of extruding an aluminum material, the heat sink 1 is assembled from a plurality of modular heat radiating units 11. Each of the heat radiating units 11 is formed on a first plane 111, say, a top surface, along each of two longitudinal edges with two parallelly extended arms 1111, and on a second plane 112 opposite to the first plane 111 with a V-shaped groove 1112 corresponding to the two arms 1111. To stack and assemble two modular heat radiating units 11 together, the parallel arms 1111 on a lower one of the two units 11 are forced into the V-shaped grooves 1112 on an upper one of the two units 11. At this point, the parallel arms 1111 are deformed corresponding to the configuration of the V-shaped grooves 1112, so that the two modular heat radiating units 11 are connected to each other. Other modular heat radiating units 11 may be sequentially stacked in the same manner. With the heat sink 1, the problem of heavy and expensive mold for casting or forging a big-scale heat sink is solved. However, the heat sink 1 has some disadvantages in practical use thereof. When the arms 1111 are forced into the V-shaped grooves 1112 and deformed, stress concentration will occur at a neck portion of the arms 1111 in contact with the first plane 111. As a result, two modular heat radiating units 11 that have been connected to each other through engagement of the arms 1111 with the V-shaped grooves 1112 are still subject to separation due to broken arms 1111. Further, it is also possible the arms 1111 are not smoothly and fully forced into the V-shaped grooves 1112, and two modular heat radiating units 11 are not fully closely attached to each other. That is, there might be voids between the arms 1111 and the V-shaped grooves 1112 to cause thermal choking. Moreover, since the arms 1111 are deformed under external force, they are not repeatedly usable.

In brief, the conventional heat sink 1 with modular heat radiating units 11 has the following disadvantages: (1) the modular heat radiating units have a connecting structure that is subject to breaking to thereby cause separation of two assembled modular heat radiating units from one another; (2) the modular heat radiating units could not be fully tightly connected and closely attached to one another to thereby cause thermal choking between them; (3) stress concentration tends to occur at deformed areas on the modular heat radiating units; (4) the modular heat radiating units have poor structural strength; and (5) the modular heat radiating units are not repeatedly usable.

It is therefore tried by the inventor to develop a heat radiating unit structure and a heat sink thereof to overcome the problems in the conventional heat sink with modular heat radiating units.

SUMMARY OF THE INVENTION

A primary object of the present invention is to provide heat radiating units that can be stably assembled to one another to provide a heat sink, so as to overcome the problems in the conventional heat sink with modular heat radiating units.

To achieve the above and other objects, the present invention provides a heat radiating unit structure and a heat sink thereof. The heat radiating unit is provided on one face with at least one raised strip having a curved head portion and a neck portion, the neck portion being located at a joint of the raised strip and one face of the heat radiating unit, and having two inward curved sidewalls to thereby have a width smaller than that of the curved head portion. The heat radiating unit is further provided on a reverse face with at least one receiving groove opposite to the raised strip, the receiving groove having a curved recess portion and an engaging shoulder portion, and the engaging shoulder portion being located at a joint of the receiving groove and the reverse face of the heat radiating unit. When a plurality of the heat radiating units is sequentially stacked by setting the raised strip on a lower heat radiating unit in the receiving groove on an upper heat radiating unit for the curved head portion and the neck portion of the lower heat radiating unit to engage with the curved recess portion and the engaging shoulder portion, respectively, of the upper heat radiating unit, the heat radiating units are stably assembled together to provide a heat sink.

The present invention provides the following advantages: (1) the heat radiating unit has simplified structure and can be easily manufactured; (2) the assembled heat radiating units can tightly bear on one another to provide good binding force between them; (3) the heat radiating units can be quickly assembled together to form the heat sink; (4) the heat radiating units have high structural strength; and (5) the heat radiating units and the heat sink thereof can be manufactured at reduced cost and high productivity.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Please refer to FIGS. 3 through 8. A heat radiating unit structure according to an embodiment of the present invention includes a heat radiating unit 3 having a main body 31, at least one receiving groove 32, and at least one raised strip 33. The main body 31 is located on at least one end of a heat radiating unit 3 with the raised strip 33 formed on a first face 311 thereof. The raised strip 33 includes a curved head portion 331 and a neck portion 332. The neck portion 332 is located at a joint of the raised strip 33 and the first face 311 of the main body 31, and has two inward curved sidewalls to thereby have a width smaller than that of the raised head portion 331. The receiving groove 32 is located on a second face 312 of the main body 31 opposite to the first face 311 to correspond to the raised strip 33. The receiving groove 32 includes a curved recess portion 321 and an engaging shoulder portion 322. The engaging shoulder portion 322 is located at a joint of the receiving groove 32 and the second face 312 of the main body 31.

A plurality of the heat radiating units 3 can be sequentially stacked and assembled to form a heat sink 4. When two pieces of the heat radiating units 3 are stacked assembled to each other, the raised strip 33 of the heat radiating unit 3 at a lower position is set in the receiving groove 32 of the other heat radiating unit 3 at an upper position, such that the curved head portion 331 and the neck portion 332 of the lower heat radiating unit 3 are engaged with the curved recess portion 321 and the engaging shoulder portion 322, respectively, of the upper heat radiating unit 3. Additional heat radiating units 3 can be further assembled to the two assembled heat radiating units 3 to form a heat sink 4.

The raised strip portion 33 is outward extended from the first face 311 of the main body 31 in a direction perpendicular to the first face 311; and the receiving groove 32 is sunk into the second face 312 of the main body 31 in a direction perpendicular to the second face 312. And, the receiving groove 32 and the raised strip 33 are correspondingly provided near each of two lateral ends of the heat radiating unit 3.

Figure 7:
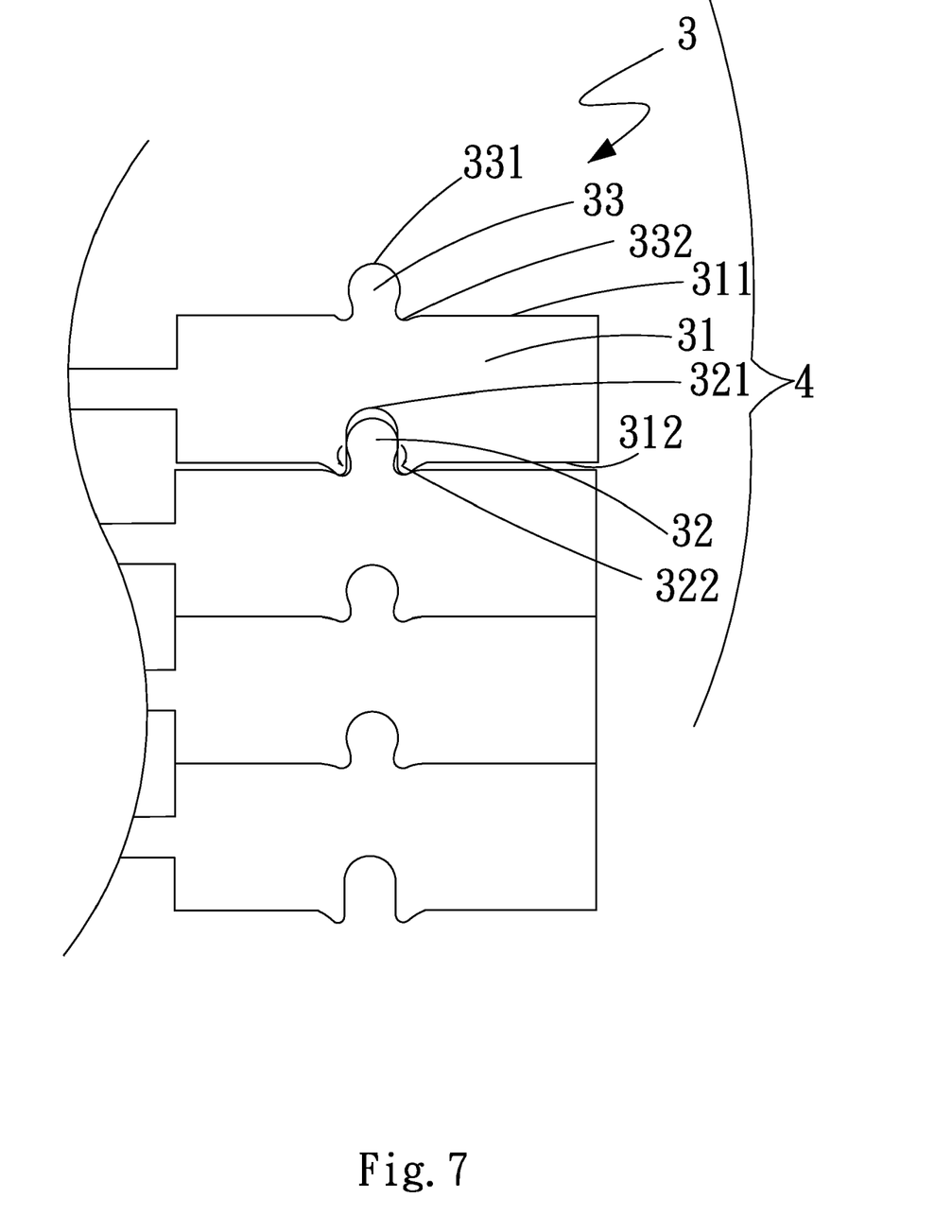
Figure 8:
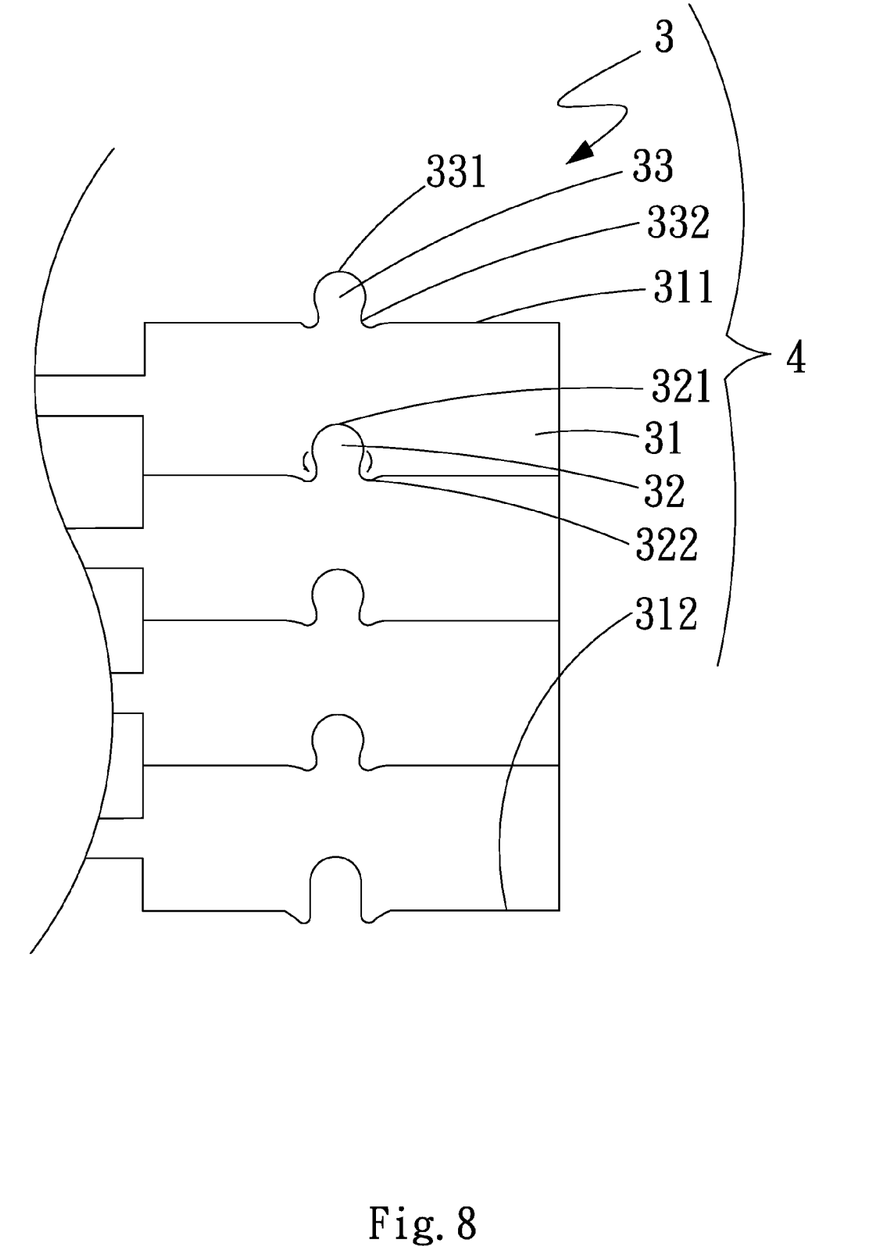

Please refer to FIGS. 7 and 8. To assemble one heat radiating unit 3 to another heat radiating unit 3, simply set the raised strips 33 of a lower one of the two heat radiating units 3 in the receiving grooves 32 of the upper one of the two heat radiating units 3 to produce a binding force between the two heat radiating units 3. At this point, the curved head portions 331 and the neck portions 332 of the lower heat radiating unit 3 are engaged with the curved recess portions 321 and the engaging shoulder portions 322, respectively, of the upper heat radiating unit 3. When the assembling continues, the engaging shoulder portions 322 of the receiving grooves 32 gradually move into the neck portions 332 of the raised strips 33 under an action of the binding force to finally tightly bear on the neck portions 332. In this manner, the two heat radiating units 3 can be assembled together without leaving any clearance between their joints. Therefore, the problem of thermal choking is solved.

The present invention has been described with a preferred embodiment thereof and it is understood that many changes and modifications in the described embodiment can be carried out without departing from the scope and the spirit of the invention that is intended to be limited only by the appended claims.

What is claimed is:

1. A heat radiating unit structure, comprising:
at least one main body being located on at least one end of a heat radiating unit;
at least one raised strip being formed on one face of the main body, and including a curved head portion and a neck portion; the neck portion being located at a joint of the raised strip and one face of the main body, and having two inward curved sidewalls to thereby have a width smaller than that of the curved head portion; and
at least one receiving groove being formed on a reverse face of the main body opposite to the raised strip, and including a curved recess portion and an engaging shoulder portion; the engaging shoulder portion being located at a joint of the receiving groove and the reverse face of the main body, wherein the main body further has a first face and a second face opposite to the first face, wherein said first face and said second face are planar surfaces parallel to the main body, and wherein the raised strip is extended outward from the first face of the main body in a direction perpendicular to the first face, wherein the receiving groove is recessed into the second face of the main body in a direction perpendicular to the second face; and wherein said raised strip fills a corresponding receiving groove upon assembly of a plurality of said main bodes.

2. A heat sink having heat radiating unit structure, comprising a plurality of heat radiating units; each of the heat radiating units having at least one main body, and the main body being provided with two faces in the form of planar surfaces parallel to the main body, the main body being further provided on one face with at least one raised strip having a curved head portion and a neck portion, the neck portion being located at a joint of the raised strip and the one face of the main body, and having two inward curved sidewalls to thereby have a width smaller than that of the curved head portion; the main body of the heat radiating unit being further provided on a reverse face with at least one receiving groove opposite to the raised strip, the receiving groove having a curved recess portion and an engaging shoulder portion, and the engaging shoulder portion being located at a joint of the receiving groove and the reverse face of the main body; whereby when the plurality of heat radiating units are sequentially stacked by setting the raised strip of a lower heat radiating unit in the receiving groove of an upper heat radiating unit for the curved head portion and the neck portion of the lower heat radiating unit to engage with the curved recess portion and the engaging shoulder portion, respectively, of the upper heat radiating unit, the heat radiating units are assembled together to provide a heat sink, wherein the main body further has a first face and a second face opposite to the first face, wherein the raised strip is extended outward from the first face of the main body in a direction perpendicular to the first face, wherein the receiving groove is recessed into the second face of the main body in a direction perpendicular to the second face.

* * * * *